United States Patent [19]

Leon et al.

[11] Patent Number: 5,787,040
[45] Date of Patent: Jul. 28, 1998

[54] DEVICE FOR THE PROTECTION OF STORED DATA

[75] Inventors: Jean-François Leon, Biver; Sébastien Zink, Aix En Provence, both of France

[73] Assignee: SGS-Thomson Microelectronics S.A., Saint Genis, France

[21] Appl. No.: 916,054

[22] Filed: Aug. 21, 1997

[30] Foreign Application Priority Data

Aug. 27, 1996 [FR] France ................... 96 10588

[51] Int. Cl.$^6$ ........................................ G11C 7/00
[52] U.S. Cl. ............... 365/189.01; 365/195; 711/163
[58] Field of Search ............... 365/189.01, 189.07, 365/195; 380/4; 711/163

[56] References Cited

U.S. PATENT DOCUMENTS

| | | | |
|---|---|---|---|
| 4,485,456 | 11/1984 | Toyoda | 364/900 |
| 4,580,246 | 4/1986 | Sibigtroth | 365/189 |
| 5,315,549 | 5/1994 | Scherpenberg et al. | 365/189 |
| 5,430,882 | 7/1995 | Tilghman et al. | 395/750 |
| 5,557,576 | 9/1996 | Roohparvar et al. | 365/195 |
| 5,668,760 | 9/1997 | Hazen | 365/195 |

FOREIGN PATENT DOCUMENTS

A-0 250 242  12/1987  European Pat. Off. ........ G11C 17/00

*Primary Examiner*—Vu A. Le
*Attorney, Agent, or Firm*—Wolf, Greenfield & Sacks, P.C.

[57] ABSTRACT

A device for protection of data stored in a memory includes a supply voltage drop detection device to set an enabling signal in an active state when a supply voltage is below a threshold and a flip-flop circuit whose output controls the state of the enabling signal concurrently with the supply voltage drop detection device so that all programming is prohibited when the flip-flop circuit stores a first state, and the protection device is organized in such a way that this state of the flip-flop circuit is modified only after the supply voltage drop detection circuit has detected that the supply voltage is below the threshold.

2 Claims, 1 Drawing Sheet

DEVICE FOR THE PROTECTION OF STORED DATA

Background Of The Invention

1. Field of the Invention

The invention relates to the field of non-volatile memories. More particularly, it relates to a device for the protection of stored data against parasitic programming operations.

2. Discussion of the Related Art

The most important feature of non-volatile memories is the fact that it guarantees the integrity of the data stored in these memories. Today, in most memories, this guarantee is provided by two types of devices: supply voltage drop detection circuits (also known as VCC Low detection circuits) and devices for logic write-protection of data (also known as software data protection).

The term "memory" is understood to mean an independent memory as well as a memory used in a circuit comprising other elements.

Circuits of the supply voltage drop detection type are detection circuits that prohibit programming (namely modification of the stored data, also called writing) if the supply voltage of the memory (or of the circuit comprising the memory) is below a certain value. This is an analog type of protection. Very often, the supply voltage drop detection and power-on reset are not distinguished from each other.

Software data protection devices generally take the form of a programmable and non-volatile internal control register whose contents represent authorization of programming or prohibition of programming. This internal register is programmed by the circuit that controls the memory (for example a microprocessor or a microcontroller, if the memory is an independent circuit). This is logic type of protection.

Both devices may be called "write inhibit" devices.

Each of these two devices has drawbacks

Let us assume that the supply voltage of a memory in operation, in which writing is permitted, starts dropping. Above a certain value, the control device (for example a microcontroller) that controls the memory works accurately. When the voltage reaches a first threshold VA, the microcontroller detects the fact that the supply has dropped. Depending on the application and depending on its duration, this phase is used for example to carry out operations for the emergency saving of data in the memory or, as the case may be, to program the register of the software data protection device so as to protect the memory against parasitic writing operations. It is also possible to configure the memory so that parasitic programming becomes more difficult, for example by configuring the memory in read mode.

When the voltage reaches a threshold VB that is lower than VA in terms of absolute value, the control device no longer works properly and behaves in a totally unpredictable manner. In particular, it may very well send write orders to the memory. In this case, the software data protection device, if it has been programmed to prohibit all programming, is a protection device that is not completely reliable. Somewhere in the memory of the microcontroller, there necessarily exists a program for the configuration of the register of the device. It may happen that the microcontroller accesses this program and thus modifies the contents of the register, permitting the writing operation. The probability that this program will be run is nevertheless far smaller than the probability of parasitic writing inasmuch as, conventionally, the programming of the register requires at least three consistent clock cycles (whereas a parasitic writing operation may get activated on a single cycle).

When the voltage reaches a third threshold VC that is smaller, in terms of absolute value, than VB, then the Supply voltage drop detection circuit incorporated in the memory detects the drop in voltage and then automatically prohibits any command for writing in the memory.

The critical period in terms of integrity of the data elements of the memory is therefore located between the thresholds VB and VC, that is to say between the time when the drop in supply voltage induces a random behavior of the control device and the time when this drop induces an automatic prohibition of all programming.

One approach would consist in choosing VC>VB. However, it is difficult in practice to make detection circuits having a threshold VC that is stable as a function of the temperature and the parameters of manufacture. Typically, to date, the devices that have been implanted in memories have a variation of±0.2 volts depending on the manufacturing parameters and±0.3 volts depending on the temperature. There is therefore an uncertainty of±0.5 volts about the value of VC.

Furthermore, the threshold VB is generally very close to the minimum value of the supply voltage on the basis of which the manufacturers guarantee normal operation of the circuits. If VC>VB, there is therefore a risk of blocking the memory whereas it should work normally.

For example, for a circuit supplied by a supply voltage of 5 volts, efficient operation is guaranteed, typically, between 4.5 and 5.5 volts. The threshold VB will be typically placed at 4.3 volts and VC will be equal to 3.8 volts±0.5 volts.

SUMMARY OF THE INVENTION

It is an aim of the invention to provide a more reliable device for the protection of stored data elements.

To achieve this and other aims, there is provided a combined system of protection by means of a flip-flop circuit that can be activated when desired but cannot be deactivated unless an analog detection device has taken over the operation. Thus, if the protection is implemented before the supply voltage has reached a level such that the circuits driving the memory show random behavior, then a random behavior of this kind, if it occurs, will have no effect on the data element, whatever the signals produced by the driving circuits.

According to the invention, programming is inhibited until the memory has detected a drop in the supply voltage. So long as the threshold VC has not been detected, the memory therefore remains protected. As soon as the threshold VC is reached, the VCC Low type detection device takes over the operation.

Thus, the invention proposes a device for protection of data stored in a memory, comprising protection means to control an enabling signal to enable programming of the memory, the programming being permitted when the enabling signal is in a first state and prohibited when this signal is in a second state, the protection means including a supply voltage drop detection device to set the enabling signal in the second state when the supply voltage is below a threshold. The device further includes a flip-flop circuit with an output controlling the state of the enabling signal concurrently with the supply voltage drop detection device so that any programming is prohibited when the flip-flop circuit memorizes a first state, and the protection device is organized in such a way that this state of the flip-flop circuit is modified only after the supply voltage drop detection circuit has detected that the supply voltage is below the threshold.

BRIEF DESCRIPTION OF THE DRAWINGS

Other advantages and features shall appear from the following description of an exemplary embodiment of the invention, to be read together with the appended drawings, of which

DETAILED DESCRIPTION

Figure 1:
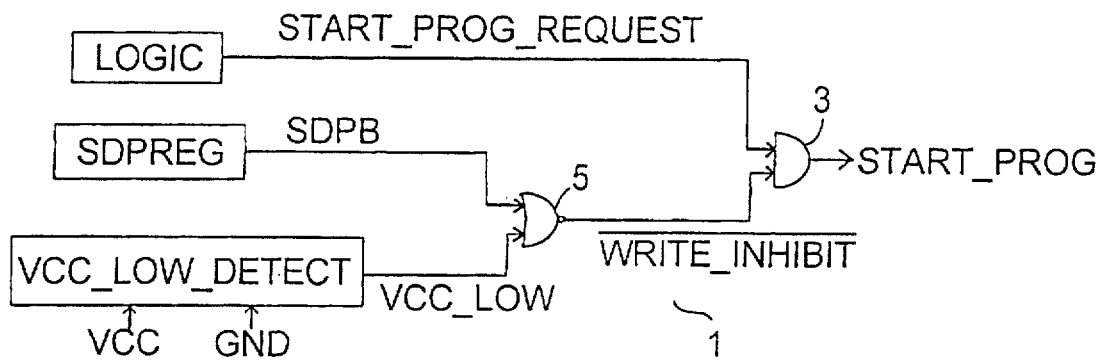
FIG. 1 shows a protection device according to the prior art and FIG. 2 shows a protection device according to the invention.

FIG. 1 shows a device 1 for protection, in programming, of data stored in a memory according to the prior art. This device can be implemented in a non-volatile memory or in a circuit comprising such a memory.

The device 1 has a control logic circuit LOGIC bearing the reference number 2. This circuit which is not described will be, for example, the circuit for decoding the control signals received from the exterior if the device 1 is integrated into an independent memory or else, again, the control circuit of the memory if the device 1 is used in a circuit comprising a memory. The circuit LOGIC referenced 2 produces the control logic signals used in the device 1 to manage the protection of the data.

Conventionally, programming is permitted or prohibited by the positioning of a logic signal /WRITE_INHIBIT for enabling programming (the notation /X represents the signal complementary to X) respectively in a first logic state called an inactive state or a second logic state called an active state. For example, it will be assumed that the inactive state is the high state and the active state is the low state.

When a programming command is sent to the circuit 2, this circuit positions a logic signal START_PROG_REQUEST in a given logic state called an active state. It will be assumed here that this logic state is the high state, the low state being called inactive. This signal is combined with the signal /WRITE_INHIBIT to produce a programming command logic signal START_PROG so that data is programmed when this signal is in a given state called the active state (it will be assumed here that this state is the high state) and so that no programming is done when this signal is in a state called an inactive state (in the example it will be assumed that it is the low state). Conventionally, the protection is expressed by the fact that the signal START_PROG remains inactive whatever the state of the signal START_PROG_REQUEST if the signal /WRITE_INHIBIT is active. If the signal /WRITE_INHIBIT is inactive, then the state of the signal START_PROG is identical to the state of the signal START_PROG_REQUEST.

Thus, in the example shown in FIG. 1, the signal START_PROG is produced by an AND type logic gate 3 receiving the signals /WRITE_INHIBIT and START_PROG_REQUEST so that START_PROG=1 if START_PROG_REQUEST=/WRITE_INHIBIT=1.

The device 1 includes a logic protection non-volatile register SDPREG. It also includes a supply voltage drop detection circuit VCC_LOW_DETECT receiving, at its input, a high supply potential VCC and a ground potential GND supplying the circuit to be protected and producing a logic signal VCC_LOW such that VCC_LOW is in a first logic state (called an inactive state) if VCC is greater than a given threshold Vthreshold and in a second state (called an active state) if it is lower. For example, VCC_LOW=1 if VCC<Vthreshold, if not VCC_LOW=0. Let SDPB be the contents of the register SDPREG. It will be assumed that all programming is prohibited if SDPB=1.

A NOR type logic gate 5 receives the signals VCC_LOW and SDPB and uses these signals to produce the signal /WRITE_INHIBIT.

Thus, if the memory is protected against programming by logic means and/or if VCC is below Vthreshold, then the programming commands of the memory are inhibited and have no effect.

Figure 2:
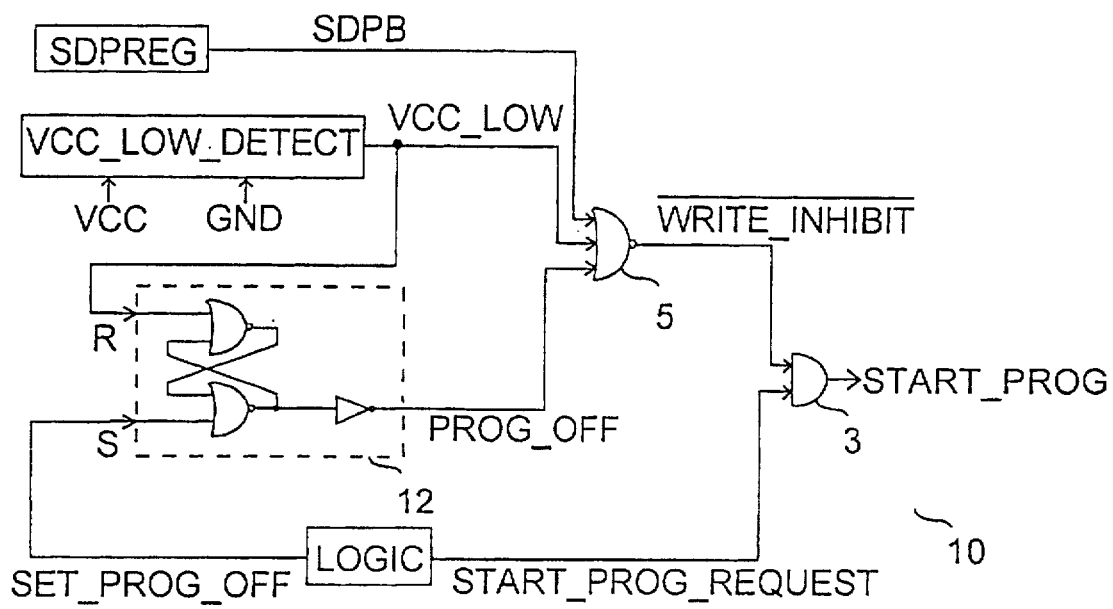

FIG. 2 illustrates a protection device 10, similar to the device of FIG. 1, implementing the invention.

It comprises, in addition to the elements of FIG. 1 (which carry the same references as in FIG. 1), a NOR type RS flip-flop circuit 12 producing a logic signal PROG_OFF. The gate 5 has a third input to receive the signal PROG_OFF.

The resetting input R of the flip-flop circuit 12 receives the signal VCC_LOW and its resetting input S receives a signal SET_PROG_OFF given for example by the control circuit 2. When a leading edge appears in the signal SET_PROG_OFF, the signal PROG_OFF goes to the high state. This imposes /WRITE_INHIBIT=0. All programming is then prohibited.

If this edge is given after a drop in voltage has been detected, only the passage of VCC below the threshold Vthreshold will be capable of inactivating the signal PROG_OFF. Protection against programming is then provided by the circuit VCC_LOW_DETECT.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for protection of data stored in a memory, comprising protection means to control an enabling signal to enable programming of a memory, programming being permitted when an enabling signal is in a first state and prohibited when this signal is in a second state, the protection means including a supply voltage drop detection device to set the enabling signal in the second state when the supply voltage is below a threshold, said device further comprising a flip-flop circuit with an output controlling the state of the enabling signal concurrently with the supply voltage drop detection device so that all programming is prohibited when the flip-flop circuit stores a first state, and the protection device is organized in such a way that this state of the flip-flop circuit is modified only after the supply voltage drop detection circuit has detected that the supply voltage is below the threshold.

2. A device according to claim 1, wherein the flip-flop circuit is an RS type flip-flop circuit having a resetting input that receives a signal from the supply voltage drop detection device, so that the state of the enabling signal is controlled by this detection device alone when it detects the first threshold.

* * * * *